United States Patent
Wu

(10) Patent No.: US 8,237,206 B2
(45) Date of Patent: Aug. 7, 2012

(54) CMOS IMAGE SENSOR, METHOD OF MAKING THE SAME, AND METHOD OF SUPPRESSING DARK LEAKAGE AND CROSSTALK FOR CMOS IMAGE SENSOR

(75) Inventor: Hsin-Ping Wu, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 348 days.

(21) Appl. No.: 12/189,815

(22) Filed: Aug. 12, 2008

(65) Prior Publication Data
US 2010/0038688 A1 Feb. 18, 2010

(51) Int. Cl.
*H01L 31/113* (2006.01)
*H01L 31/00* (2006.01)

(52) U.S. Cl. ......... 257/291; 257/72; 257/227; 257/292; 257/293; 257/439; 257/446; 257/E27.132; 257/E27.133; 257/E31.122; 257/E31.123

(58) Field of Classification Search .......... 257/227, 257/439, 446, 72, 291, 292, 293, E27.132, 257/E27.133, E31.122, E31.123
See application file for complete search history.

(56) References Cited

U.S. PATENT DOCUMENTS

| 6,087,211 | A | 7/2000 | Kalnitsky et al. |
| 6,960,512 | B2 | 11/2005 | Cheng et al. |
| 6,967,316 | B2 * | 11/2005 | Lee .............................. 250/208.1 |
| 7,060,960 | B2 * | 6/2006 | Ohta et al. ................... 250/214.1 |
| 2002/0187581 | A1 * | 12/2002 | Yang ................................ 438/48 |
| 2004/0036009 | A1 * | 2/2004 | Takayanagi et al. ........ 250/208.1 |
| 2005/0118743 | A1 * | 6/2005 | Maeng et al. .................... 438/57 |
| 2005/0176167 | A1 * | 8/2005 | Lee .................................... 438/60 |
| 2006/0011808 | A1 * | 1/2006 | Li et al. ........................ 250/208.1 |
| 2006/0180885 | A1 * | 8/2006 | Rhodes ......................... 257/432 |
| 2007/0012970 | A1 | 1/2007 | Mouli |
| 2007/0029589 | A1 * | 2/2007 | Bahl et al. ..................... 257/290 |
| 2008/0217719 | A1 * | 9/2008 | Liu et al. ....................... 257/446 |

FOREIGN PATENT DOCUMENTS

| TW | 430925 | 4/2001 |
| TW | 200411914 | 7/2004 |
| TW | 200633196 | 9/2006 |

* cited by examiner

*Primary Examiner* — Long Tran
(74) *Attorney, Agent, or Firm* — Winston Hsu; Scott Margo

(57) ABSTRACT

A CMOS image sensor, in which an implantation process is performed on substrate under isolation structures each disposed between two adjacent photosensor cell structures. The implantation process is a destructive implantation to form lattice effects/trap centers. No defect repair process is carried out after the implantation process is performed. The implants can reside at the isolation structures or in the substrate under the isolation structures. Dark leakage and crosstalk are thus suppressed.

17 Claims, 4 Drawing Sheets

CMOS IMAGE SENSOR, METHOD OF MAKING THE SAME, AND METHOD OF SUPPRESSING DARK LEAKAGE AND CROSSTALK FOR CMOS IMAGE SENSOR

BACKGROUND OF THE INVENTION

1. Field of the Invention

The present invention relates to a complementary metal-oxide-semiconductor (CMOS) image sensor (CIS), and particularly to a CMOS image sensor able to suppress dark leakage and crosstalk, the method of making the same, and the method of the suppression.

2. Description of the Prior Art

CMOS image sensors nowadays are widely applied in digital electrical products. For example, the line CMOS image sensor is predominately applied in the scanners, and the plane CMOS image sensor is predominately applied in the digital camera. Because the standard CMOS transistor manufacturing processes and the recent semiconductor equipments and technologies can be employed to manufacture the CMOS image sensors, the yield of the CMOS image sensor is increasing.

FIG. 1 shows a schematic cross sectional view of a conventional CMOS image sensor. As shown in FIG. 1, a semiconductor substrate 10 is a heavy doped P type substrate ($P^+$ substrate). A lightly doped P type well ($P^-$ well) 12 is formed in the semiconductor substrate 10. A plurality of photodiodes 14 are formed in the P type well 12. A shallow trench isolation (STI) 16 with the P type well together acts as an electrically insulating material to prevent short-circuiting due to contact between the photodiodes 14 and other components. The photodiodes 14 is covered with a SiN/SiON multilayer serving as an anti-reflection coating (ARC) 18 for a better response.

However, the formation of the ARC layer and/or the STI often leads Si of the underlying substrate under stress that will increase the risk of junction leakage. Furthermore, under the miniaturization of devices, the distance between the photosensor cell structures is decreased, while the photosensor cell structures are wanted to be as deep as possible for improving the capacity. However, the depth of shallow trench isolation is generally from 3000 to 4000 angstroms which is far not as deep as the desired photosensor cell structures. Moreover, a P type substrate is employed. Therefore, the charges will have a charge life long enough to migrate to an adjacent pixel easily, leading to crosstalk.

Therefore, a novel structure or method is still needed to solve the problems of dark leakage and crosstalk for CMOS image sensors.

SUMMARY OF THE INVENTION

An objective of the present invention is to provide a CMOS image sensor and a method of making the same, which can suppress dark leakage and crosstalk. Thus, in another aspect of the present invention, a method of suppressing dark leakage and crosstalk for a CMOS image sensor is also provided.

In one aspect of the present invention, the CMOS image sensor comprises a substrate, a plurality of photosensor cell structures disposed in the substrate, a plurality of isolation structures each disposed in the substrate between two adjacent ones of the photosensor cell structures; and a defect region disposed in the substrate under each of the isolation structures, wherein the defect region comprises a plurality of lattice defects distributed in the substrate.

In another aspect of the present invention, the method of making a CMOS image sensor comprises providing a substrate, forming a plurality of photosensor cell structures in the substrate, forming a dielectric layer covering the photosensor cell structures, forming a plurality of isolation structures in the substrate between two adjacent photosensor cell structures, and performing an implantation process to dispose implants in the substrate under the isolation structures, thereby forming defect regions comprising a plurality of lattice defects distributed in the substrate, and not repairing the lattice defects for the implantation process.

In still another aspect of the present invention, the method of suppressing dark leakage and crosstalk for a CMOS image sensor comprises providing a half-finished product of a CMOS image sensor, which comprises a substrate, a plurality of photosensor cell structures disposed in the substrate, and a plurality of isolation structures each disposed in the substrate between two adjacent ones of the photosensor cell structures; and performing an implantation process to dispose implants in the substrate under the isolation structures, thereby forming defect regions comprising a plurality of lattice defects distributed in the substrate, and not repairing the lattice defects for the implantation process.

In the present invention, an implant or implants are disposed in the substrate (which may include an epitaxial layer) under the isolation structures to form lattice defects/trap centers, and no defect repairing process is performed after the implantation, so as to retain the lattice defects/trap centers in the lattices of the substrate under the isolation structures. The stress caused by the formation of the ARC layer and the like or the isolation structure can be also relaxed, and dark leakage can be reduced. These trap centers can improve charge recombination rate to avoid crosstalk.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
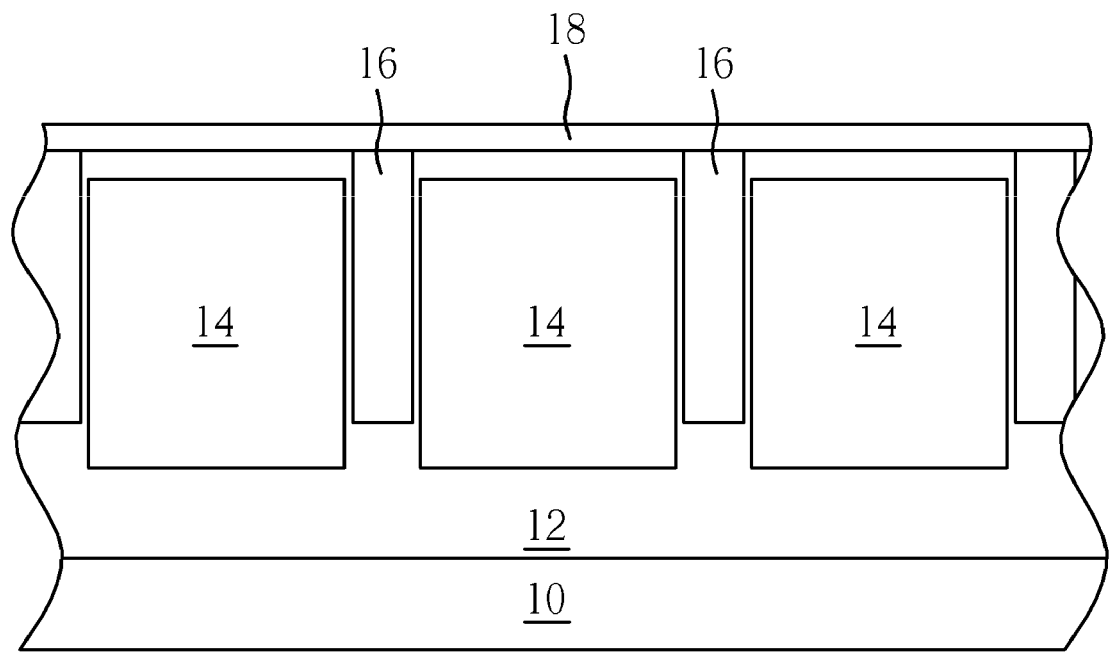
FIG. 1 shows a schematic cross sectional view of a conventional CMOS image sensor.
Figure 2:
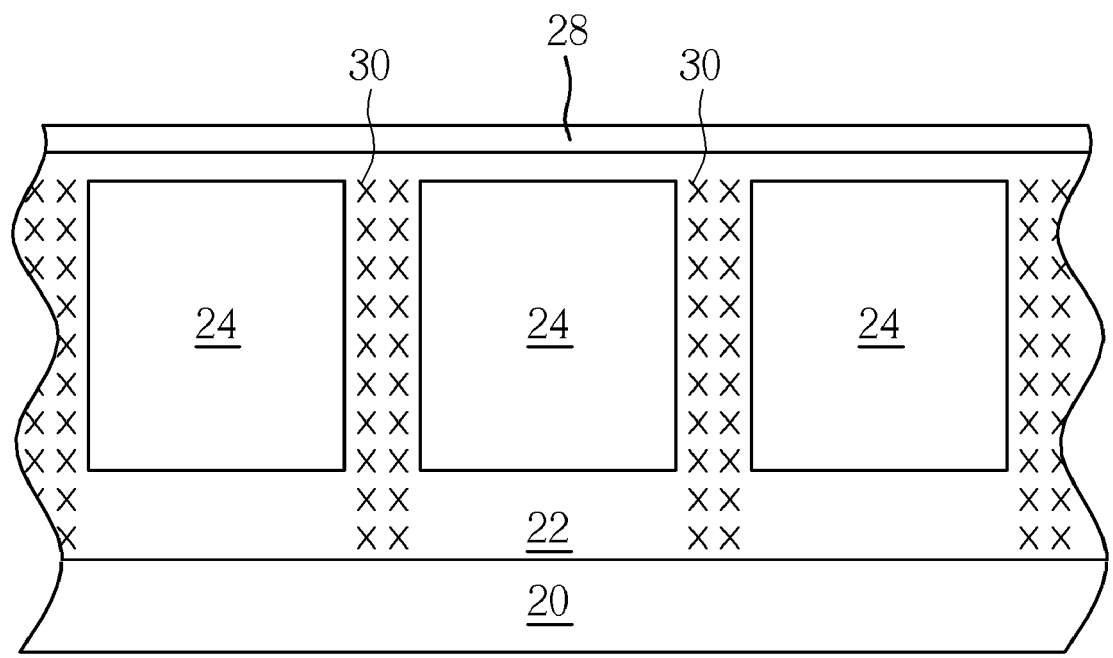
FIG. 2 shows a schematic cross sectional view illustrating an embodiment of the CMOS image sensor according to the present invention.

FIG. 2 shows a schematic cross sectional view of an embodiment of the CMOS image sensor according to the present invention. The CMOS image sensor includes a substrate, which may include a semiconductor substrate 20 and an epitaxial layer 22 on the semiconductor substrate 20. A plurality of photosensor cell structures 24 are disposed in the epitaxial layer 22. Isolation structures are each disposed in the epitaxial layer 22 between the photosensor cell structures 24. Implants 30 are at the isolation structures and in the epitaxial layer 22 thereunder. There are lattice defects distributed in the region where the implants are disposed, to form a "defect region" as referred in the specification. The CMOS image sensor may further include a dielectric layer 28 covering over the photosensor cell structures 24.

The substrate may be a semiconductor substrate, which may be a P type or N type semiconductor substrate or a silicon-on-insulator (SOI). An epitaxial layer may be further formed on the semiconductor substrate. In FIG. 2, the substrate includes the semiconductor substrate 20, e.g. heavily doped P type (P$^+$) semiconductor substrate, and the epitaxial layer 22 on the semiconductor substrate 20. The epitaxial layer 22 may be a semiconductor epitaxial layer, e.g. silicon epitaxial layer, further doped with P or N type dopants, such as P$^-$ dopants in this embodiment. The photosensor cell structures 24 may be conventional photosensor cell structures. The dielectric layer 28 may be a salicide block (also referred to as self-aligned block, SAB) to protect regions from being metal silicidated in a salicidation process, an anti-reflection coating to enhance the light quantity received by the photosensor cell structures, or an interlayer dielectric (ILD layer) to provide protection to the photosensor cell structures, or all of these three ones may be formed. The photosensor cell structures are electrically isolated from each other by the isolation structures. The isolation structures may be conventional shallow trench isolations or diffused isolation structures doped with reverse type dopants, i.e. well isolation structures.

Figure 3:
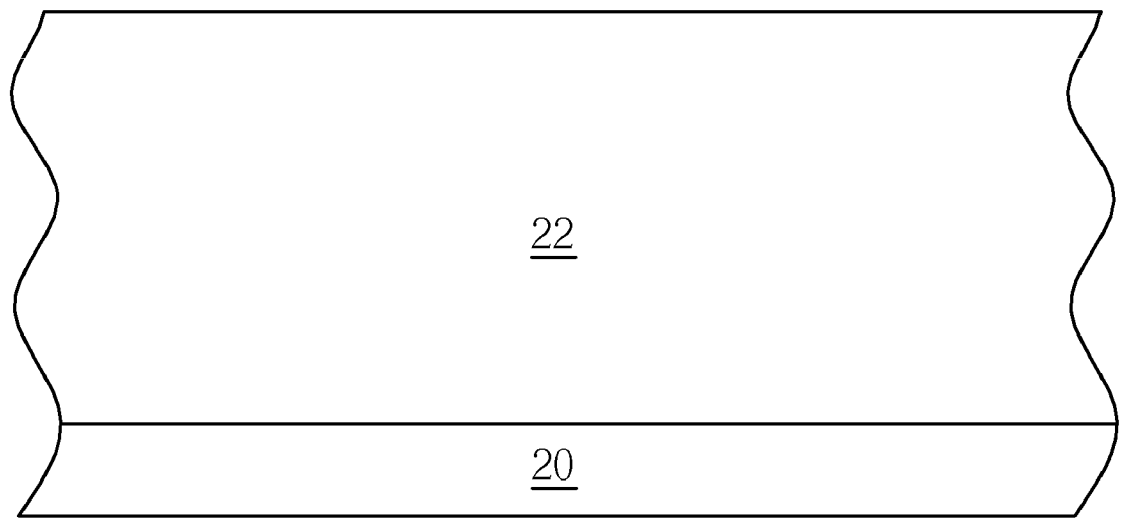
FIGS. 3-5 show schematic cross sectional views illustrating an embodiment of the method of making a CMOS image sensor according to the present invention.
Figure 4:
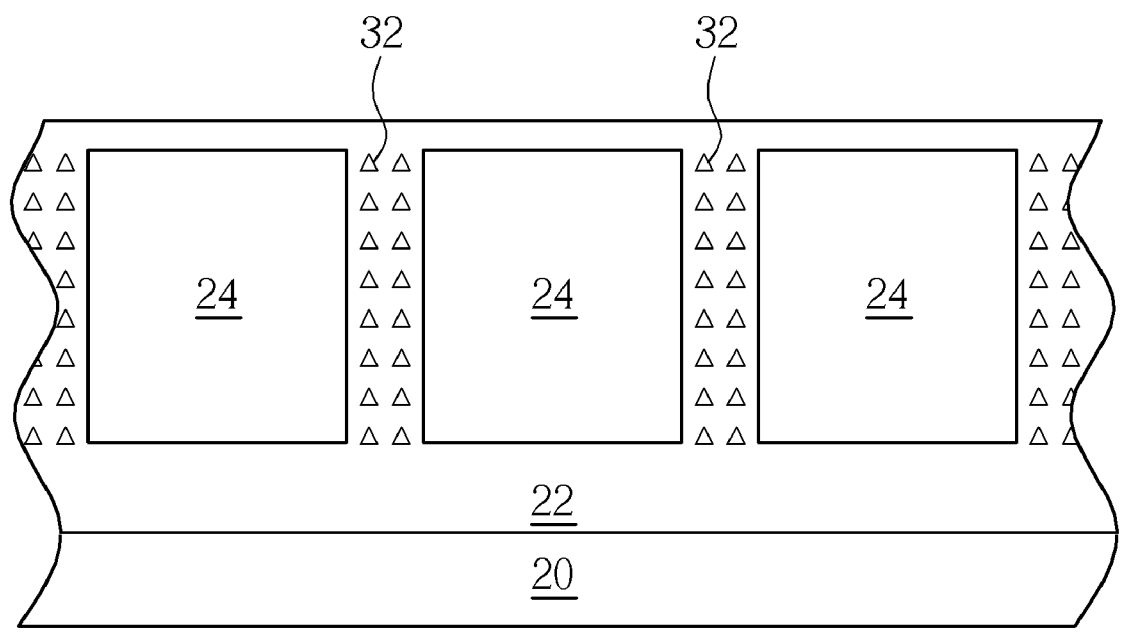
Figure 5:
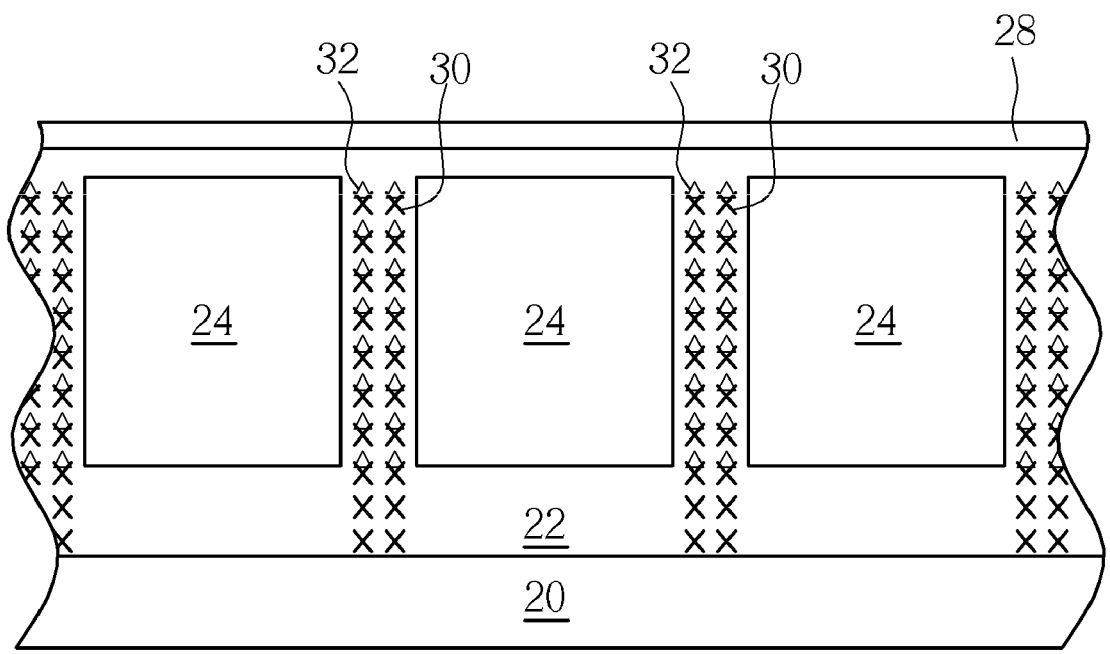

FIGS. 3-5 show schematic cross sectional views illustrating an embodiment of the method of making a CMOS image sensor according to the present invention. As shown in FIG. 3, first, a substrate, such as a semiconductor substrate 20, is provided. The semiconductor substrate 20 may be for example a P$^+$ semiconductor substrate. An epitaxial growth process may be further performed to form an epitaxial layer 22 on the semiconductor substrate 20. The epitaxial layer 22 is further lightly doped with for example P type dopants.

As shown in FIG. 4, next, the photosensor cell structures 24 are formed by performing for example an N type doping process on the epitaxial layer 22. Thereafter, the isolation structures are formed. One type of the isolation structures is shown in FIG. 4, which are well isolation structures formed by doping in the isolation regions. The dopants 32 may be a reverse type dopants relative to the photosensor cell structures (e.g. N type), e.g. P type dopants.

As shown in FIG. 5, the dielectric layer 28 may be formed first, or the implantation of the implants 30 may be performed first. For example, in the case that the dielectric layer 28 is formed first, the dielectric layer 28, such as an SAB layer, an anti-reflection coating, or an ILD layer, is formed on the surface of the photosensor cell structures 24 and the isolation structures, and then the implantation process is performed using a patterned photoresist layer as a mask to shield the photosensor cell structures 24.

In the case that the implantation of the implants 30 is performed first, the implantation is performed using a patterned photoresist layer as a mask, and then an SAB layer, an anti-reflection coating, or an ILD layer, is formed on the surface of the photosensor cell structures 24 and the isolation structures. The thickness (e.g. 5000 angstroms) of the photoresist layer used when the implantation process is performed first is thicker than that (e.g. 3000 angstroms) used when the implantation process is performed later, because the existing dielectric layer may attribute as a portion of the mask in the implantation process performed later.

The distribution of the implants 30 may be as shown in FIG. 5 that the implants 30 are distributed at the isolation structures and in the epitaxial layer 22 beneath/under the isolation structures. The depth may reach the bottom of the epitaxial layer 22, i.e. the original surface of the semiconductor substrate 20. One of the main features of the present invention is to allow the implant depth to reach at least the bottom of the isolation structures, so as to form defects/trap centers in the epitaxial layer at the proximity of the bottom of the isolation structures. For example, the implant depth may be set in the about middle part and the lower part of the epitaxial layer. After these two times of implantation, the implants may distribute at and under the isolation structures as desired. The implants 30 and the dopants 32 of the well isolation structures may overlap each other. The place where the implants reside and the proximity are typically a relatively intensively destructive region and defects/trap centers are formed therein to become a defect region.

Figure 6:
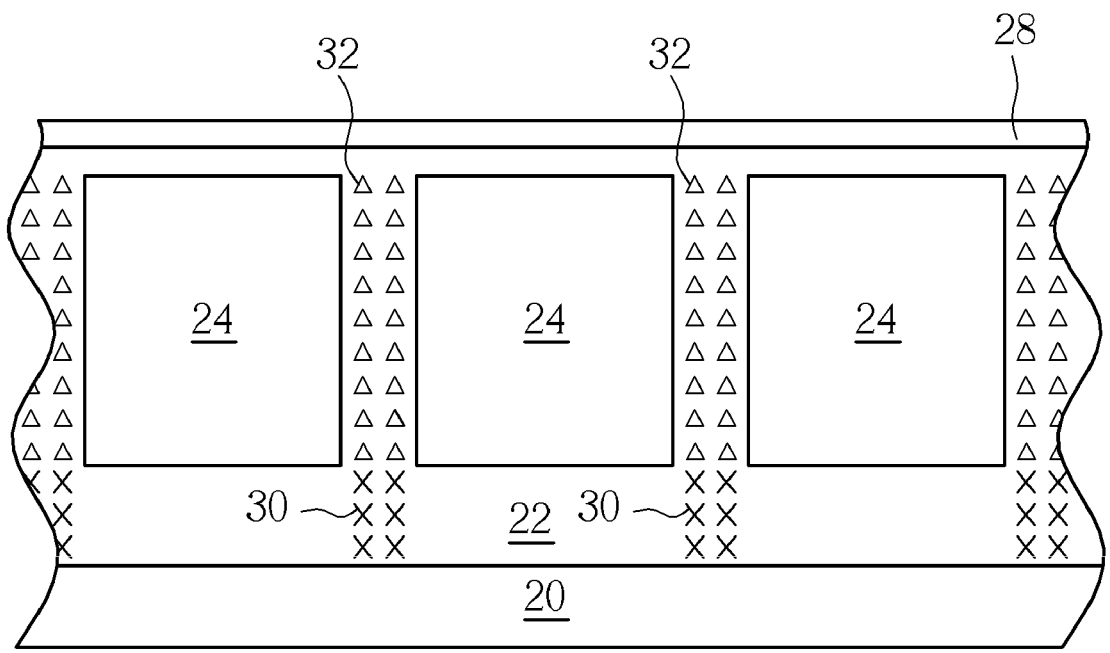
FIG. 6 shows a schematic cross sectional view illustrating another embodiment of the method of making a CMOS image sensor according to the present invention.

Alternatively, as shown in FIG. 6, the implant depth may be controlled to allow the implants 30 to mostly distribute only in the epitaxial layer 22 under the isolation structures.

Figure 7:
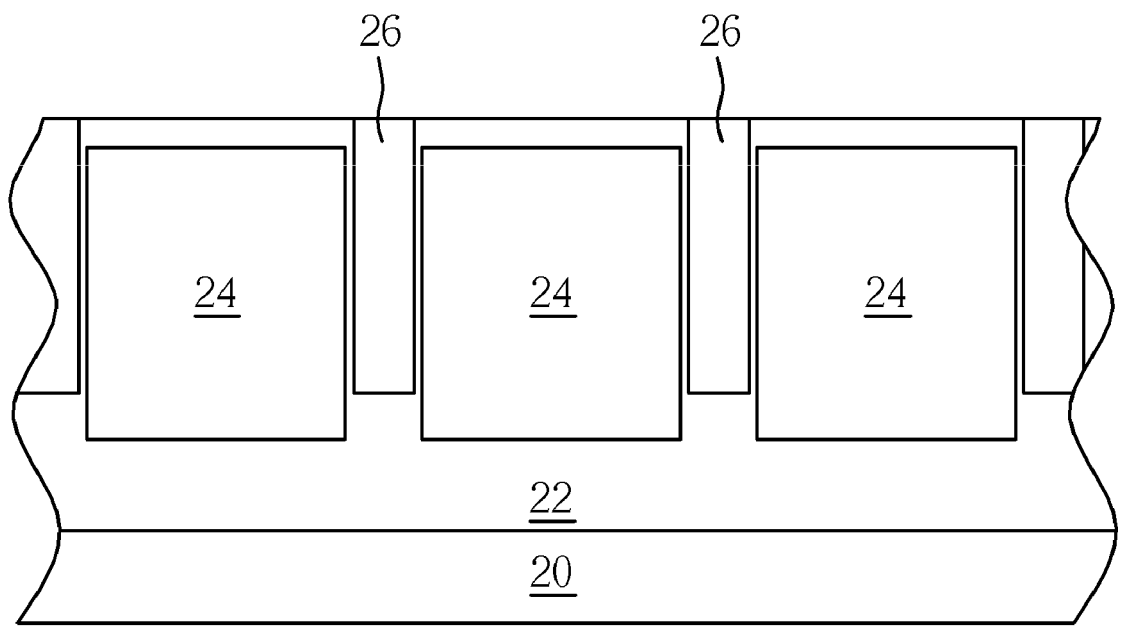
FIGS. 7 and 8 show schematic cross sectional views illustrating still another embodiment of the method of making a CMOS image sensor according to the present invention.
Figure 8:
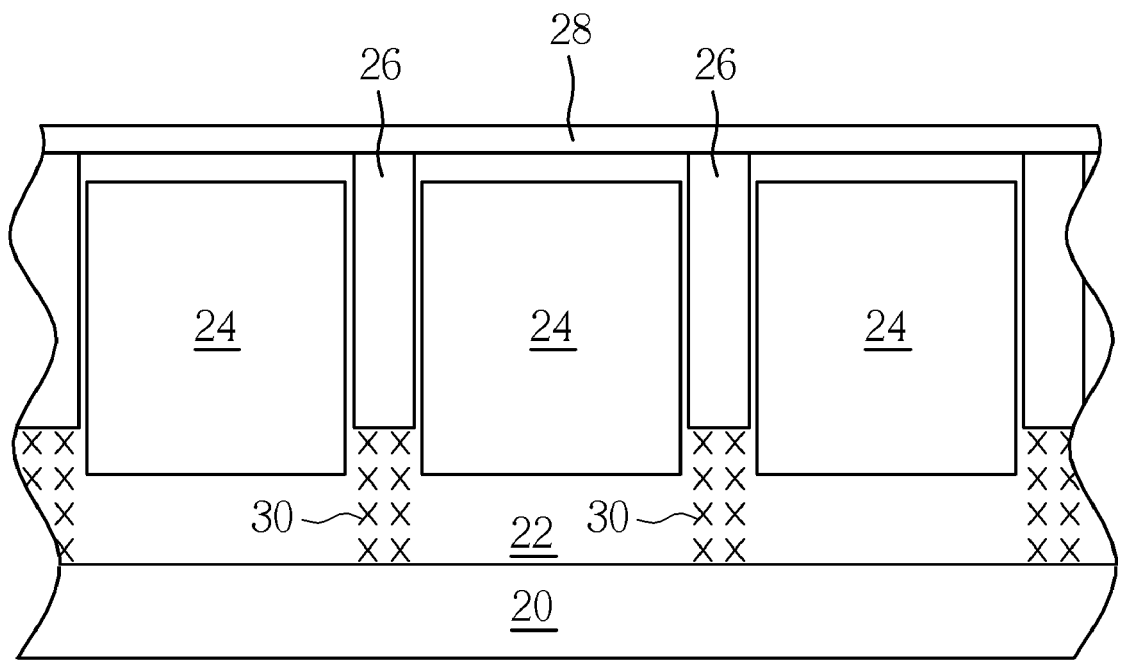

The isolation structures for the photosensor cell structures may be shallow trench isolations as in the embodiment shown in FIGS. 7 and 8. After the formation of the epitaxial layer 22 as shown in FIG. 3, the photosensor cell structures 24 are formed by doping for example N type dopants in the epitaxial layer 22, and then the isolation structures are formed, as shown in FIG. 7, i.e., forming the shallow trench isolations 26 in the isolation region and defining the isolated the photosensor cell structures 24.

Thereafter, as shown in FIG. 8, the dielectric layer 28 may be formed first, or the implantation of the implants 30 may be performed first. For example, as mentioned above, in the case that the dielectric layer 28 is formed first, the dielectric layer 28 is formed on the surface of the photosensor cell structures 24 and the shallow trench isolations 26, and then the implantation is performed using a mask to form the implants 30. In the case that the implantation of the implants 30 is performed first, the implantation is performed using a mask to form the implants 30, and then the dielectric layer 28 is formed on the surface of the photosensor cell structures 24 and the shallow trench isolations 26.

Because the shallow trench isolations 26 are oxide, the implant depth of the implants 30 may be set between the bottom of the shallow trench isolations 26 and the bottom of the epitaxial layer 22. For example, the implant depth may be set at two places, such as in the about middle part and the lower part of the epitaxial layer. The resulting implants and defects/trap centers may distribute in the epitaxial layer under the shallow trench isolations.

According to the embodiment of the present invention mentioned above, a method of suppressing dark leakage and crosstalk for a CMOS image sensor is provided. The method includes performing an implantation process on a half-finished product of a CMOS image sensor to dispose implants in the substrate beneath/under the isolation structures, but not repairing the lattice defects for the implantation process. The implantation process may be performed before or after the formation of the dielectric layer. It should be noted that particularly no annealing process is carried out after the implantation in the present invention, to prevent the lattice defects from being repaired that will result in losing the desired trap centers. Typically, after a doping process for forming N type photosensor cell structures or P well isolation structures is carried out, an annealing process is carried out to repair lattice defects caused by the doping process.

One of the features of the present invention is to dispose implants in the substrate under the isolation structures. It is on purpose to produce defects/trap centers in the substrate under the isolation structures by performing the implantation. The implant depth ought to reach at least the bottom of the isolation structures, so as to distribute the defects/trap centers in the substrate under the isolation structures. Generally, the distance between two photosensor cell structures may be 0.5 μm, while the depth of the shallow trench isolation is just between 0.3 μm and 0.4 μm. It is often desirable to increase the size and depth of the photosensor cell structure, and thus the implant depth can be controlled to reach at least the bottom of the isolation structure and the implants may be allowed to further continuously distribute in the deeper substrate to provide better function. For example, the depth may be deeper than the photosensor cell structures, even until reaching the bottom of the epitaxial layer (for example, equivalent to the surface of the semiconductor substrate 20) if it exists. An epitaxial layer generally has a thickness of 4 μm to 7 μm. It is not limited for the implant depth to be in the semiconductor substrate 20, while no better function is obtained then. The isolation structure is a path of the implantation, and the implants may reside therein. Furthermore, it should be noted that P-N junctions should be avoided being implanted.

Destructiveness is desired for the implantation in the substrate under the isolation structures in the present invention. Such effect can be accomplished by employing proper implant energy. Accordingly, there is not a strict limitation to the implant species. Generally, the implant with a great mass is of great destructiveness, because a heavy implant easily collides with the epitaxial atom (such as silicon atom), resulting in a significant displacement of the epitaxial atom. As heavy ions, N type implants may include for example phosphorus (P) ion, arsenic (As) ion, and the like, and P type implants may include for example indium (In) ion, argon (Ar) ion, and the like. However, light ions (such as boron ion) and neutral atoms are not excluded. Preferably, heavy ions with a reverse type relative to the photosensor cell structure and a similar attribution to the diffused isolation structure may be used, such that the epitaxial lattice can acquire proper destruction, as well as the isolation can be improved due to the electricity of the implants per se. The implants used in the implantation process can include one or more implant species.

The implant dose may be preferably from $1 \times 10^{12}$ to $5 \times 10^{13}$ atoms/cm$^2$, but not limited thereto, depending on PN junction forming by photodiode and isolation implant conditions. The implant energy may be determined depending on implant species, isolation structures, epitaxial materials, and implant depths. Higher implant energy means that the implants may be in the deeper epitaxial layer. For example, about one Mega eV of implant energy may be used when using boron implants. Generally, just 300 to 400 keV of energy is used to make doped wells. 500 to 1500 keV of energy may be used when using P, As, In, or Ar implants.

It should be noted that the implantation process may be carried out before or after the formation of each dielectric layer such as a salicide block, an anti-reflection coating, or an interlayer dielectric. If the implantation is performed after one of the layers is formed, the stress of the substrate caused by the formation of that layer can be soothed and accordingly the current leakage can be reduced. The implantation process may be carried out immediately after the formation of one of the dielectric layers. However, the implants need to pass through the layer of dielectric material. If the dielectric layer includes a silicon nitride layer, more implant energy is required. In other situation that, for alleviating the stress applied on the underlying substrate by the dielectric layer, the dielectric layer (such as an ILD layer) may be formed and further patterned to remove portions over the isolation structures for reducing the stress as the conventional technique. If so, the implantation process of the present invention may be integrated with such patterning process of the dielectric layer. That is, the photoresist layer for pattering the dielectric layer can be reused with the patterned dielectric layer together as an implant mask to shield the photosensor cell structures in the implantation process of the present invention. Such implant mask can sufficiently block the high energy implants and protect the regions not to be implanted. Furthermore, the reduced implant energy can be used because there is no dielectric layer disposed on the implant regions. The dielectric layer may be for example a composite layer of oxide liner—silicon nitride/silicon oxynitride (SiN/SiON) layer (500 angstroms)—silicon oxide layer (4500 angstroms). The SiN/SiON layer may serve as an anti-reflection layer for the photosensor cell structures and also a stop etch layer for the structures on the logic region.

Those skilled in the art will readily observe that numerous modifications and alterations of the device and method may be made while retaining the teachings of the invention.

What is claimed is:

1. A CMOS image sensor comprising:
   a substrate having a first type of conductivity, wherein the substrate comprises a semiconductor substrate and an epitaxial layer disposed on the semiconductor substrate;
   a plurality of photosensor cell structures disposed in the epitaxial layer of the substrate;
   a plurality of isolation structures each disposed in the epitaxial layer of the substrate between two adjacent ones of the photosensor cell structures; and
   a defect region disposed in the substrate under each of the isolation structures, wherein the defect region comprises a plurality of lattice defects distributed in the substrate and extends from the bottom of the isolation structures to the junction between the epitaxial layer and the substrate, and the defect region further comprises implants comprising atoms neutral or having a second type of conductivity different from the first type of conductivity.

2. The CMOS image sensor of claim 1, wherein the defect region extends from beneath the isolation structure to the substrate at a depth deeper than the photosensor cell structures.

3. The CMOS image sensor of claim 1, wherein the isolation structures comprise shallow trench isolations.

4. The CMOS image sensor of claim 1, wherein the isolation structures comprise well isolations.

5. The CMOS image sensor of claim 1, further comprising a salicide block covering the photosensor cell structures.

6. The CMOS image sensor of claim 1, further comprising an anti-reflection coating covering the photosensor cell structures.

7. The CMOS image sensor of claim 1, further comprising an interlayer dielectric layer covering the photosensor cell structures.

8. The CMOS image sensor of claim 1, further comprising an interlayer dielectric layer covering the photosensor cell structures.

9. A CMOS image sensor comprising:
   a substrate having a first type of conductivity, wherein the substrate comprises a semiconductor substrate and an epitaxial layer disposed on the semiconductor substrate;
   a plurality of photosensor cell structures disposed in the epitaxial layer of the substrate;
   a plurality of isolation structures each disposed in the epitaxial layer of the substrate between two adjacent ones of the photosensor cell structures; and
   a defect region disposed in the substrate under each of the isolation structures, wherein the defect region extends from the bottom of the isolation structures to the junction between the epitaxial layer and the substrate and comprises a plurality of trap centers distributed in the substrate, and the trap centers are formed and retained through an implantation process performed to dispose implants comprising atoms neutral or having a second type of conductivity different from the first type of conductivity in the substrate under each of the isolation structures followed by no annealing processes.

10. The CMOS image sensor of claim 9, wherein the defect region extends from beneath the isolation structure to the substrate at a depth deeper than the photosensor cell structures.

11. The CMOS image sensor of claim 9, further comprising a salicide block covering the photosensor cell structures.

12. The CMOS image sensor of claim 9, further comprising an anti-reflection coating covering the photosensor cell structures.

13. A CMOS image sensor comprising:
a substrate, wherein the substrate comprises a semiconductor substrate and an epitaxial layer disposed on the semiconductor substrate;
a plurality of photosensor cell structures disposed in the epitaxial layer of the substrate;
a plurality of P-well or N-well isolation structures each disposed in the epitaxial layer of the substrate between two adjacent ones of the photosensor cell structures, the P-well or N-well isolation structures having dopants; and
a defect region disposed in the substrate under each of the isolation structures, wherein the defect region extends from the bottom of the isolation structures to the junction between the epitaxial layer and the substrate and comprises a plurality of trap centers distributed in the substrate, the trap centers are formed and retained through an implantation process performed to dispose implants in the substrate under each of the isolation structures followed by no annealing processes, and the implants comprising neutral atoms different from the dopants.

14. The CMOS image sensor of claim 13, wherein the defect region extends from beneath the isolation structure to the substrate at a depth deeper than the photosensor cell structures.

15. The CMOS image sensor of claim 13, further comprising a salicide block covering the photosensor cell structures.

16. The CMOS image sensor of claim 13, further comprising an anti-reflection coating covering the photosensor cell structures.

17. The CMOS image sensor of claim 13, further comprising an interlayer dielectric layer covering the photosensor cell structures.

* * * * *